United States Patent
Huang

(10) Patent No.: US 7,744,244 B2
(45) Date of Patent: Jun. 29, 2010

(54) LIGHT EMITTING DIODE WITH LIGHT EMITTING CHIPS AT INNER SIDE SURFACES THEREOF AND BACKLIGHT MODULE USING SAME

(75) Inventor: Xiong-Biao Huang, Shenzhen (CN)

(73) Assignees: Innocom Technology (Shenzhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 243 days.

(21) Appl. No.: 12/152,091

(22) Filed: May 12, 2008

(65) Prior Publication Data

US 2008/0278965 A1 Nov. 13, 2008

(30) Foreign Application Priority Data

May 11, 2007 (CN) .................. 2007 2 0120038 U

(51) Int. Cl.
*F21V 9/16* (2006.01)
*G09F 13/04* (2006.01)

(52) U.S. Cl. .................. 362/231; 362/84; 362/97.3; 362/612; 257/89; 313/501

(58) Field of Classification Search .................. 362/231, 362/84, 612, 97.3, 800; 257/88, 89, 98–100; 313/501–503
See application file for complete search history.

(56) References Cited

U.S. PATENT DOCUMENTS

| | | | | |
|---|---|---|---|---|
| 3,789,211 A | * | 1/1974 | Kramer | 362/231 |
| 3,875,456 A | * | 4/1975 | Kano et al. | 313/501 |
| 6,236,382 B1 | * | 5/2001 | Kawakami et al. | 345/83 |
| 7,133,093 B2 | | 11/2006 | Ochiai et al. | |
| 7,419,280 B2 | * | 9/2008 | Chou | 362/231 |
| 7,564,180 B2 | * | 7/2009 | Brandes | 313/501 |
| 2007/0246714 A1 | * | 10/2007 | Koike et al. | 257/79 |

* cited by examiner

*Primary Examiner*—Bao Q Truong
(74) *Attorney, Agent, or Firm*—Wei Te Chung

(57) ABSTRACT

An exemplary light emitting diode includes a main body, a red light emitting chip, a green light emitting chip, and a blue light emitting chip. The main body includes two inner side surfaces opposite to each other and a inner bottom surface connected with the side surfaces. The side surfaces and the bottom surface cooperatively define an accommodating space. The red light emitting chip, the green light emitting chip and the blue light emitting chip are positioned at the bottom surface and the side surfaces of the accommodating space, respectively.

20 Claims, 3 Drawing Sheets

LIGHT EMITTING DIODE WITH LIGHT EMITTING CHIPS AT INNER SIDE SURFACES THEREOF AND BACKLIGHT MODULE USING SAME

FIELD OF THE INVENTION

The present invention relates to a light emitting diode and a backlight module using the light emitting diode.

GENERAL BACKGROUND

A typical liquid crystal display has the advantages of portability, low power consumption, and low radiation, and has been widely used in various portable information products such as notebooks, personal digital assistants (PDAs), video cameras and the like. Furthermore, the liquid crystal display is considered by many to have the potential to completely replace cathode ray tube (CRT) monitors and televisions. A liquid crystal display typically includes a backlight module including a plurality of light emitting diodes.

Referring to FIG. 4, a typical light emitting diode 100 includes a main body 110, two electrodes 120, a blue light emitting chip 130, and some potting 140. The main body 110 defines an accommodating space 111. The accommodating space 111 is defined by a bottom surface 112, and a peripheral surface (not labeled) connected with the bottom surface 112. The blue light emitting chip 130 is fixed on the bottom surface 112 in the accommodating space 111, and is electrically connected with the electrodes 120 by conductive lines (not labeled). The electrodes 120 are placed on an outer surface of the main body 110, and are insulated from each other. The potting 140 fills the accommodating space 111, and includes yellow fluorescent powder 141. The blue light chip 130 emits blue light beams. The yellow fluorescent powder 141 is activated by the blue light beams, and thereby emits white light beams. However, the white light beams are usually not pure.

Referring to FIG. 5, another typical light emitting diode 200 is shown. The light emitting diode 200 is similar to the light emitting diode 100. However, the light emitting diode 200 includes a main body 210, a blue light emitting chip 231, a red light emitting chip 232, and a green light emitting chip 233. The main body 210 defines an elongate accommodating space 211. The blue light emitting chip 231, the red light emitting chip 232 and the green light emitting chip 233 are aligned on a bottom surface 212 in the accommodating space 211.

Usually, the light emitting diode 200 can be made with an elongate shape for easy assembly. However, because the blue light emitting chip 231, the red light emitting chip 232 and the green light emitting chip 233 are aligned in the accommodating space 211, a bulk of the light emitting diode 200 is increased.

What is needed, therefore, is a light emitting diode that can overcome the above-described problems. What is also needed is a backlight module employing the light emitting diode.

SUMMARY

In one embodiment, a light emitting diode includes a main body, a red light emitting chip, a green light emitting chip, and a blue light emitting chip. The main body includes two inner side surfaces opposite to each other and an inner bottom surface connected with the side surfaces. The side surfaces and the bottom surface cooperatively define an accommodating space. The red light emitting chip, the green light emitting chip and the blue light emitting chip are positioned on the bottom surface and the side surfaces of the accommodating space, respectively.

Other novel and advantages features will become more apparent from the following detailed description when taken in conjunction with the accompanying drawings.

DETAILED DESCRIPTION OF PREFERRED EMBODIMENTS

Reference will now be made to the drawings to describe preferred and exemplary embodiments in detail.

Figure 1:
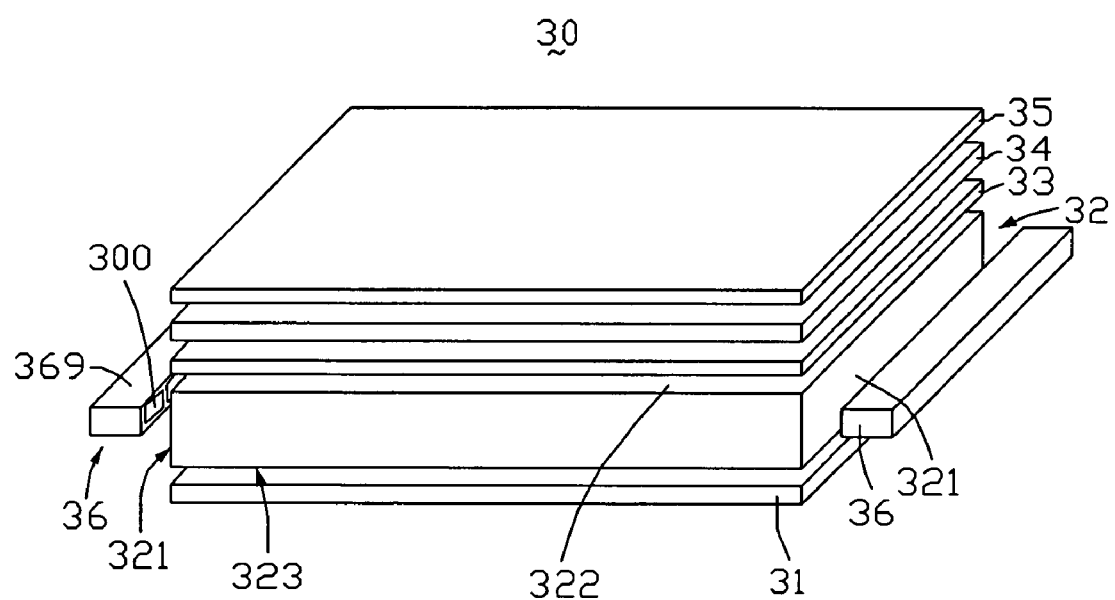
FIG. 1 is an isometric, exploded view of a backlight module according to a first embodiment of the present invention, the backlight module including a plurality of light emitting diodes.

Referring to FIG. 1, a backlight module 30 according to a first embodiment of the present invention is shown. The backlight module 30 includes a reflection film 31, a light guide plate 32, a first diffusion film 33, a brightness enhancement film 34, and a second diffusion film 35 arranged in that order from bottom to top. The light guide plate 32 includes two light incident surfaces 321 at opposite sides thereof respectively, a top light emitting surface 322 perpendicularly adjoining the light incident surfaces 321, and a bottom surface 323 perpendicularly adjoining the light incident surfaces 321. The backlight module 30 also includes two light bars 36, which are positioned adjacent to the light emitting surfaces 321 of the light guide plate 32 respectively.

Each light bar 36 includes a housing 369 and a plurality of light emitting diodes 300. The housing 369 is elongate, and defines a plurality of recesses (not labeled) spaced apart from each other. The light emitting diodes 300 are fixed in the recesses, respectively. Each two adjacent light emitting diodes 300 are spaced apart a distance, for facilitating dissipation of heat therefrom.

Figure 2:
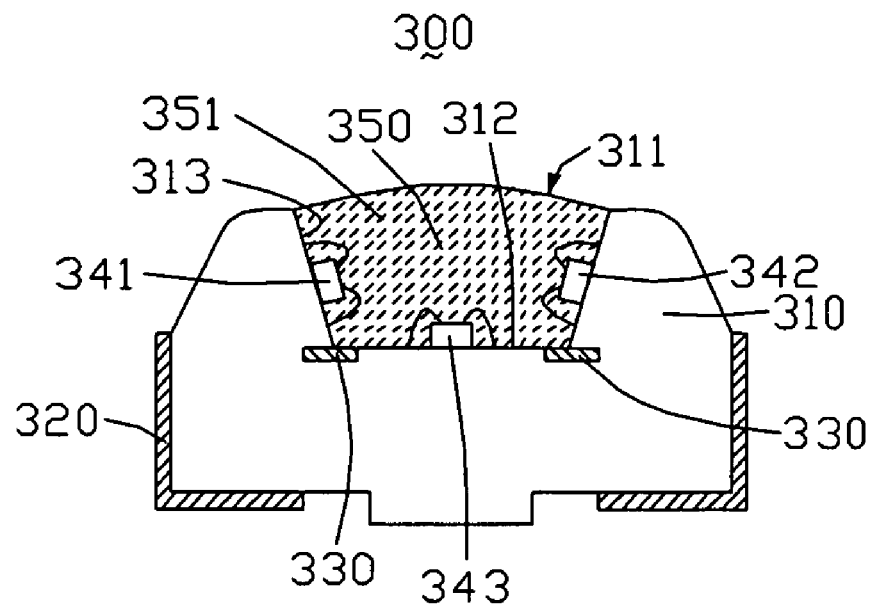
FIG. 2 is an enlarged, cross-sectional view of one of the light emitting diodes of FIG. 1.

Referring also to FIG. 2, each light emitting diode 300 is used for emitting white light beams. The light emitting diode 300 includes a main body 310, two outer electrodes 320, two inner electrodes 330, a red light emitting chip 341, a green light emitting chip 342, a blue light emitting chip 343, and some potting 350. The main body 310 is made from insulating material, and defines an accommodating space 311 therein. The inner electrodes 330 are embedded at an inner surface (not labeled) of the main body 310 at a bottom of the accommodating space 311 (as illustrated), and are insulated from each other. The outer electrodes 320 are fixed on an outer surface (not labeled) of the main body 310, and are insulated from each other. The outer electrodes 320 are used as an anode and a cathode of the light emitting diode 300, respectively. The red light emitting chip 341, the green light emitting chip 342, and the blue light emitting chip 343 are positioned in the accommodating space 311, and are all connected with the inner electrodes 330 by conductive wires (not labeled). The outer electrodes 320 provide a working voltage to the red light emitting chip 341, the green light emitting chip 342, and the blue light emitting chip 343 via the inner electrodes 330 and the conductive wires.

In the present embodiment, the accommodating space 311 is defined by four side surfaces 313 connected end to end, and a bottom surface 312 connected with the four side surfaces 313. In the illustrated embodiment, the side surfaces 313 are sloped, such that the accommodating space 311 is tapered from top to bottom. The blue light emitting chip 343 is fixed on the bottom surface 312 in the accommodating space 311. The red light emitting chip 341 and the green light emitting chip 342 are fixed on two opposite side surfaces 313 in the accommodating space 311. The accommodating space 311 is filled with the potting 350. The potting 350 is made from transparent material or semi-transparent material, and includes yellow fluorescent powder 351.

The red light emitting chip 341 emits red light beams. The green light emitting chip 342 emits green light beams. The blue light emitting chip 343 emits blue light beams. The red light beams, the green light beams, and the blue light beams are mixed into a plurality of pure white light beams and a plurality of blue light beams. The blue light beams are nominally divided into a first plurality of blue light beams and a second plurality of blue light beams. The yellow fluorescent powder 351 is activated by the first plurality of blue light beams to emit yellow light beams. The yellow light beams are mixed with the second plurality of blue light beams, thereby producing pure white light beams. The pure white light beams are emitted from the light emitting diode 300.

Compared with typical light emitting diodes, the light emitting diode 300 of the backlight module 30 has the green light emitting chip 342 and the red light emitting chip 341 positioned on the two side surfaces 313 of the accommodating space 311. Thus, a bulk of the light emitting diode 300 is correspondingly reduced. This means each light bar 36 can be made more compactly, and/or accommodate a larger number of light emitting diodes 300 if desired. Accordingly, the backlight module 30 can be more compact and/or have a desired light emitting diode 300 illumination pattern or configuration.

Figure 3:
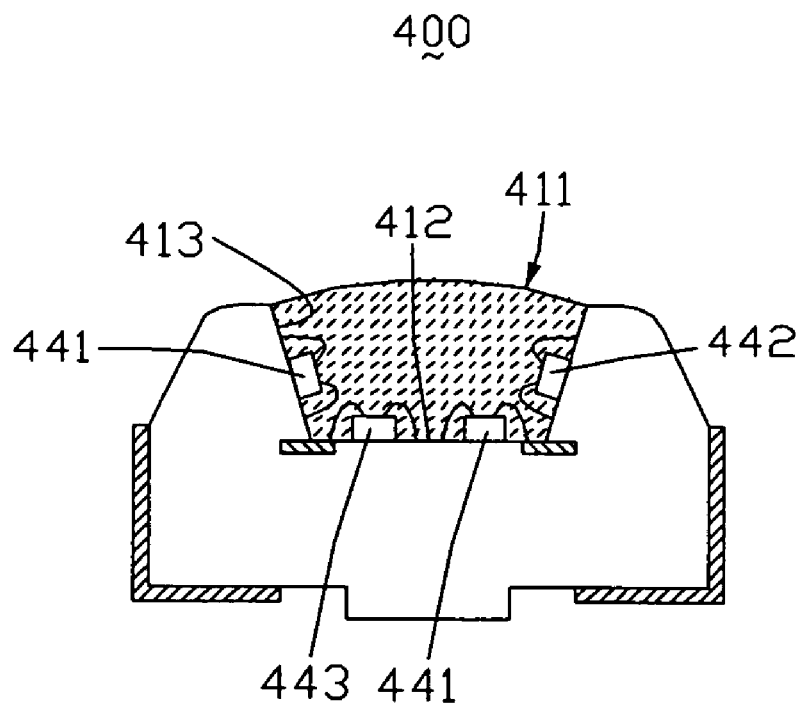
FIG. 3 is a cross-sectional view of a light emitting diode of a backlight module according to a second embodiment of the present invention.
Figure 4:
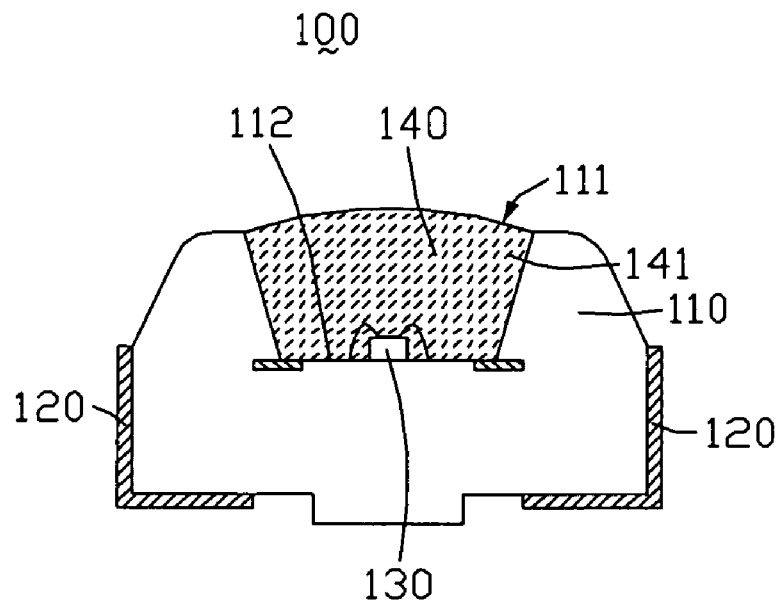
FIG. 4 is a cross-sectional view of a conventional light emitting diode.
Figure 5:
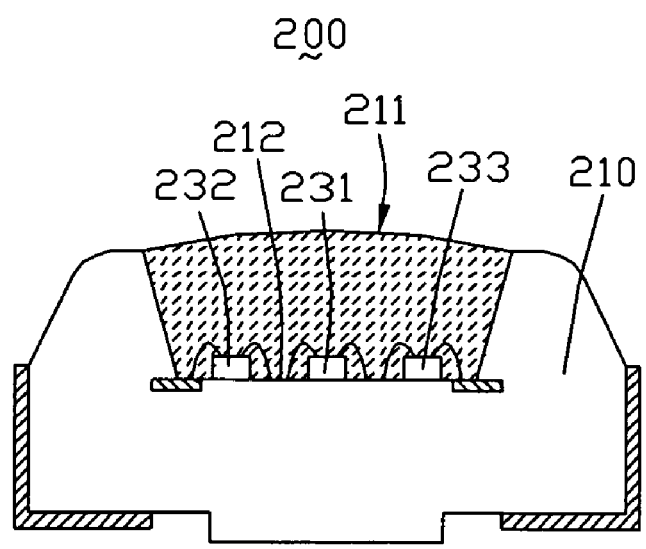
FIG. 5 is a cross-sectional view of another conventional light emitting diode.

Referring to FIG. 3, a light emitting diode 400 of a backlight module (not shown) according to a second embodiment of the present invention is shown. The light emitting diode 400 is similar to the light emitting diode 300. However, the light emitting diode 400 includes two red light emitting diodes 441, a green light emitting chip 442, and a blue light emitting chip 443. One of the red light emitting diodes 441 and the blue light emitting chip 443 are fixed on a bottom surface 412 in an accommodating space 411. The other red light emitting diode 441 and the green light emitting chip 442 are fixed on two opposite side surfaces 413 in the accommodating space 411.

Compared with typical light emitting diodes, the light emitting diode 400 has one red light emitting chip 441 and the green light emitting chip 442 positioned on the side surfaces 413 in the accommodating space 411. Thus the light emitting diode 400 has a reduced bulk. The backlight module using the light emitting diode 400 has advantages similar to those described above in relation to the backlight module 30.

Further or alternative embodiments may include the following. In one example, a red light emitting chip, a green light emitting chip, and a blue light emitting chip can be positioned at two inner side surfaces and a inner bottom surface of a main body, respectively, in any desired arrangement.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A light emitting diode comprising:
a main body comprising two inner side surfaces generally opposite to each other and an inner bottom surface connected with the side surfaces, the side surfaces and the bottom surface cooperatively defining an accommodating space;
a red light emitting chip;
a green light emitting chip; and
a blue light emitting chip; the red light emitting chip, the green light emitting chip and the blue light emitting chip being positioned at the bottom surface and the side surfaces, respectively.

2. The light emitting diode in claim 1, wherein light emitted from the red, green and blue light emitting chips mixes and produces white light beams.

3. The light emitting diode in claim 1, further comprising some potting, the potting filling the accommodating space.

4. The light emitting diode in claim 3, wherein the potting comprises yellow fluorescent powder.

5. The light emitting diode in claim 1, further comprising two outer electrodes provided at an outer surface of the main body, the outer electrodes capable of functioning as an anode and a cathode, respectively.

6. The light emitting diode in claim 5, further comprising two inner electrodes provided at least one surface selected from the group consisting of the bottom surface, and the side surfaces at the accommodating space, the inner electrodes being electrically connected with the outer electrodes, respectively.

7. The light emitting diode in claim 6, wherein the red light emitting chip, the green light emitting chip and the blue light emitting chip are electrically connected with the inner electrodes by a plurality of conductive wires.

8. The light emitting diode in claim 1, wherein the green light emitting chip and the red light emitting chip are provided at the side surfaces in the accommodating space, respectively.

9. The light emitting diode in claim 8, further comprising another red light emitting chip provided at the bottom surface in the accommodating space.

10. A light emitting diode comprising:
a main body comprising an inner first side surface, an inner second side surface generally opposite to the first side surface and an inner bottom inner surface connected with the first side surface and the second side surface, the first side surface, the second side surface and the bottom surface cooperatively defining a receptacle;
a first color light emitting chip provided at the first side surface;
a second color light emitting chip provided at the second side surface; and
a third color light emitting chip provided at the bottom surface.

11. A backlight module comprising:
a light guide plate comprising at least one light incident surface; and
a light emitting diode provided adjacent to the at least one light incident surface; the light emitting diode comprising:
a main body comprising two inner side surfaces generally opposite to each other and an inner bottom surface connected with the side surfaces, the side surfaces and the bottom surface cooperatively defining an accommodating space;

a red light emitting chip;

a green light emitting chip; and a blue light emitting chip; the red light emitting chip, the green light emitting chip and the blue light emitting chip being fixed at the bottom surface and the side surfaces, respectively.

12. The backlight module in claim 11, wherein light emitted from the red, green and blue light emitting chips mixes and produces white light beams.

13. The backlight module in claim 11, further comprising some potting, the potting filling the accommodating space.

14. The backlight module in claim 13, wherein the potting is made from transparent materials or semi-transparent materials.

15. The backlight module in claim 13, wherein the potting comprises yellow fluorescent powder.

16. The backlight module in claim 11, further comprising two outer electrodes provided on an outer surface of the main body, the outer electrodes capable of functioning as an anode and a cathode, respectively.

17. The backlight module in claim 16, further comprising two inner electrodes provided at least one surface selected from the group consisting of the bottom surface, and the side surfaces at the accommodating space, the inner electrodes being electrically connected with the outer electrodes, respectively.

18. The backlight module in claim 17, wherein the red light emitting chip, the green light emitting chip and the blue light emitting chip are electrically connected with the inner electrodes by a plurality of conductive wires.

19. The backlight module in claim 11, wherein the green light emitting chip and the red light emitting chip are provided at the side surfaces in the accommodating space, respectively.

20. The backlight module in claim 19, further comprising another red light emitting chip provided at the bottom surface in the accommodating space.

\* \* \* \* \*